US007485345B2

(12) United States Patent
Renn et al.

(10) Patent No.: US 7,485,345 B2
(45) Date of Patent: *Feb. 3, 2009

(54) APPARATUSES AND METHODS FOR MASKLESS MESOSCALE MATERIAL DEPOSITION

(75) Inventors: Michael J. Renn, Hudson, WI (US); Bruce H. King, Albuquerque, NM (US); Marcelino Essien, Cedar Crest, NM (US); Gregory J. Marquez, Albuquerque, NM (US); Manampathy G. Giridharan, Mason, OH (US); Jyh-Cherng Sheu, Hsinchu (TW)

(73) Assignee: Optomec Design Company, Albuquerque, NM (US)

( * ) Notice: Subject to any disclaimer, the term of this patent is extended or adjusted under 35 U.S.C. 154(b) by 325 days.

This patent is subject to a terminal disclaimer.

(21) Appl. No.: 11/317,457

(22) Filed: Dec. 22, 2005

(65) Prior Publication Data

US 2006/0233953 A1   Oct. 19, 2006

Related U.S. Application Data

(60) Division of application No. 10/346,935, filed on Jan. 17, 2003, now Pat. No. 7,045,015, which is a continuation-in-part of application No. 09/574,955, filed on May 19, 2000, now Pat. No. 6,823,124, which is a continuation of application No. 09/408,621, filed on Sep. 30, 1999, now abandoned, said application No. 10/346,935 is a continuation-in-part of application No. 09/584,997, filed on Jun. 1, 2000, now Pat. No. 6,636,676, which is a continuation-in-part of application No. 09/575,955, filed on May 19, 2000, now Pat. No. 6,823,124, said application No. 10/346,935 is a continuation-in-part of application No. 10/060,960, filed on Jan. 30, 2002, now abandoned, which is a continuation-in-part of application No. 09/584,997, filed on Jun. 1, 2000, now Pat. No. 6,636,676, and a continuation-in-part of application No. 09/574,955, filed on May 19, 2000, now Pat. No. 6,823,124, said application No. 10/346,935 is a continuation-in-part of application No. 10/072,605, filed on Feb. 5, 2002, now Pat. No. 7,108,894, which is a continuation-in-part of application No. 09/584,997, filed on Jun. 1, 2000, now Pat. No. 6,636,676, and a continuation-in-part of application No. 09/574,955, filed on May 19, 2000, now Pat. No. 6,823,124.

(60) Provisional application No. 60/102,418, filed on Sep. 30, 1998.

(51) Int. Cl.
*B05D 5/00* (2006.01)

(52) U.S. Cl. .................. 427/421.1; 427/427.4; 427/101; 427/384

(58) Field of Classification Search ............. 427/421.1, 427/101, 384, 427.4, 162
See application file for complete search history.

(56) References Cited

U.S. PATENT DOCUMENTS

| | | | |
|---|---|---|---|
| 3,590,477 | A | 7/1971 | Cheroff et al. |
| 3,715,785 | A | 2/1973 | Brown et al. |
| 3,808,432 | A | 4/1974 | Ashkin |
| 3,808,550 | A | 4/1974 | Ashkin |
| 3,846,661 | A | 11/1974 | Brown et al. |
| 3,854,321 | A | 12/1974 | Dahneke |
| 3,901,798 | A | 8/1975 | Peterson |
| 3,959,798 | A | 5/1976 | Hochberg et al. |
| 3,974,769 | A | 8/1976 | Hochberg et al. |
| 3,982,251 | A | 9/1976 | Hochberg |
| 4,016,417 | A | 4/1977 | Benton |
| 4,019,188 | A | 4/1977 | Hochberg |
| 4,046,073 | A | 9/1977 | Mitchell et al. |
| 4,046,074 | A | 9/1977 | Hochberg et al. |
| 4,092,535 | A | 5/1978 | Ashkin et al. |
| 4,112,437 | A | 9/1978 | Mir et al. |
| 4,132,894 | A | 1/1979 | Yule |
| 4,171,096 | A | 10/1979 | Welsh et al. |
| 4,200,660 | A | 4/1980 | Schaefer et al. |
| 4,228,440 | A | 10/1980 | Horike et al. |
| 4,269,868 | A | 5/1981 | Livsey |

| | | | | | | |
|---|---|---|---|---|---|---|
| 4,323,756 A | 4/1982 | Brown et al. | | 6,293,659 B1 | 9/2001 | Floyd et al. |
| 4,453,803 A | 6/1984 | Hidaka et al. | | 6,340,216 B1 | 1/2002 | Peeters et al. |
| 4,485,387 A | 11/1984 | Drumheller | | 6,348,687 B1 | 2/2002 | Brockmann et al. |
| 4,497,692 A | 2/1985 | Gelchinski et al. | | 6,379,745 B1 | 4/2002 | Kydd et al. |
| 4,605,574 A * | 8/1986 | Yonehara et al. ............ 427/424 | | 6,406,137 B1 | 6/2002 | Okazaki et al. |
| 4,670,135 A | 6/1987 | Marple et al. | | 6,416,156 B1 | 7/2002 | Noolandi et al. |
| 4,689,052 A | 8/1987 | Ogren et al. | | 6,416,157 B1 | 7/2002 | Peeters et al. |
| 4,825,299 A | 4/1989 | Okada et al. | | 6,416,158 B1 | 7/2002 | Floyd et al. |
| 4,826,583 A | 5/1989 | Biernaux et al. | | 6,416,159 B1 | 7/2002 | Floyd et al. |
| 4,893,886 A | 1/1990 | Ashkin et al. | | 6,454,384 B1 | 9/2002 | Peeters et al. |
| 4,904,621 A | 2/1990 | Loewenstein et al. | | 6,467,862 B1 | 10/2002 | Peeters et al. |
| 4,911,365 A | 3/1990 | Thiel et al. | | 6,481,074 B1 | 11/2002 | Karlinski |
| 4,947,463 A | 8/1990 | Matsuda et al. | | 6,503,831 B2 | 1/2003 | Speakman |
| 4,997,809 A | 3/1991 | Gupta | | 6,521,297 B2 | 2/2003 | McDougall et al. |
| 5,032,850 A | 7/1991 | Andeen et al. | | 6,544,599 B1 | 4/2003 | Brown et al. |
| 5,043,548 A | 8/1991 | Whitney et al. | | 6,548,122 B1 | 4/2003 | Sharma et al. |
| 5,064,685 A | 11/1991 | Kestenbaum et al. | | 6,573,491 B1 | 6/2003 | Marchitto et al. |
| 5,164,535 A | 11/1992 | Leasure | | 6,636,676 B1 | 10/2003 | Renn |
| 5,170,890 A | 12/1992 | Wilson et al. | | 6,646,253 B1 | 11/2003 | Rohwer et al. |
| 5,182,430 A | 1/1993 | Lagain | | 6,780,377 B2 | 8/2004 | Hall et al. |
| 5,194,297 A | 3/1993 | Scheer et al. | | 6,823,124 B1 | 11/2004 | Renn et al. |
| 5,208,431 A | 5/1993 | Uchiyama et al. | | 2001/0046551 A1 | 11/2001 | Falck et al. |
| 5,250,383 A | 10/1993 | Naruse | | 2002/0012743 A1 | 1/2002 | Sampath et al. |
| 5,254,832 A | 10/1993 | Gartner et al. | | 2002/0100416 A1 | 8/2002 | Sun et al. |
| 5,270,542 A | 12/1993 | McMurry et al. | | 2002/0132051 A1 | 9/2002 | Choy |
| 5,292,418 A | 3/1994 | Morita et al. | | 2002/0162974 A1 | 11/2002 | Orsini et al. |
| 5,322,221 A | 6/1994 | Anderson | | 2003/0003241 A1 | 1/2003 | Suzuki et al. |
| 5,335,000 A | 8/1994 | Stevens | | 2003/0048314 A1 | 3/2003 | Renn |
| 5,344,676 A | 9/1994 | Kim et al. | | 2003/0117691 A1 | 6/2003 | Bi et al. |
| 5,366,559 A | 11/1994 | Periasamy | | 2003/0175411 A1 | 9/2003 | Kodas et al. |
| 5,378,505 A | 1/1995 | Kubota et al. | | 2003/0180451 A1 | 9/2003 | Kodas et al. |
| 5,378,508 A | 1/1995 | Castro et al. | | 2003/0202043 A1 | 10/2003 | Moffat et al. |
| 5,403,617 A | 4/1995 | Haaland | | 2003/0219923 A1 | 11/2003 | Nathan et al. |
| 5,449,536 A | 9/1995 | Funkhouser | | 2003/0228124 A1 | 12/2003 | Renn et al. |
| 5,486,676 A | 1/1996 | Aleshin | | 2004/0151978 A1 | 8/2004 | Huang |
| 5,495,105 A | 2/1996 | Nishimura et al. | | 2004/0179808 A1 | 9/2004 | Renn |
| 5,512,745 A | 4/1996 | Finer et al. | | 2004/0197493 A1 | 10/2004 | Renn et al. |
| 5,607,730 A | 3/1997 | Ranalli | | 2004/0247782 A1 | 12/2004 | Hampden-Smith et al. |
| 5,612,099 A | 3/1997 | Thaler | | 2006/0008590 A1 | 1/2006 | King et al. |
| 5,614,252 A | 3/1997 | McMillan et al. | | | | |
| 5,648,127 A | 7/1997 | Turchan et al. | | FOREIGN PATENT DOCUMENTS | | |
| 5,676,719 A | 10/1997 | Stavropoulos et al. | | EP | 0 331 022 A2 | 9/1989 |
| 5,733,609 A | 3/1998 | Wang | | EP | 0 444 550 A2 | 9/1991 |
| 5,736,195 A | 4/1998 | Haaland | | WO | WO-01/83101 A1 | 11/2001 |
| 5,770,272 A | 6/1998 | Biemann et al. | | | | |
| 5,772,106 A | 6/1998 | Ayers et al. | | OTHER PUBLICATIONS | | |

Fernandez de la Mora, J., et al., "Aerodynamic focusing of particles in a carrier gas", *J. Fluid Mech.*, vol. 195, printed in Great Britain,(1988),1-21.

King, Bruce, et al., "M3D TM Technology: Maskless Mesoscale TM Materials Deposition", *Optomec pamphlet*, (2001).

Miller, Doyle, et al., "Maskless Mesoscale Materials Deposition", *HDI*, vol. 4, No. 9,(Sep. 2001),1-3.

Rao, N. P., et al., "Aerodynamic Focusing of Particles in Viscous Jets", *J. Aerosol Sci.*, vol. 24, No. 7, Pergamon Press, Ltd., Great Britain,(1993),879-892.

Renn, Michael J., et al., "Flow- and Laser-Guided Direct Write of Electronic and Biological Components", *Direct-Write Technologies for Rapid Prototyping Applications*, Academic Press,(2002),475-492.

Zhang, Xuefeng, et al., "A Numerical Characterization of Particle Beam Collimation by an Aerodynamic Lens-Nozzle System: Part I. An Individual Lens or Nozzle", *Aerosol Science and Technology*, vol. 36, Taylor and Francis,(2002),617-631.

*Webster's Ninth New Collegiate Dictionary*, Merriam-Webster, Inc., Springifled, MA. USA,(1990),744.

Ashkin, A, "Acceleration and Trapping of Particles by Radiation Pressure", *Physical Review Letters*, (Jan. 26, 1970), 156-159.

Ashkin, A., "Optical trapping and manipulation of single cells using infrared laser beams", *Nature*, (Dec. 1987),769-771.

Dykhuizen, R. C., "Impact of High Velocity Cold Spray Particles", (May 13, 2000),1-18.

Lewandowski, H. J., et al., "Laser Guiding of Microscopic Particles in Hollow Optical Fibers", *Announcer 27, Summer Meeting—Invited and Contributed Abstracts*, (Jul. 1997),89.

Marple, V. A., et al., "Inertial, Gravitational, Centrifugal, and Thermal Collection Techniques", *Aerosol Measurement: Principles, Techniques and Applications*, (2001),229-260.

Odde, D. J., et al., "Laser-Based Guidance of Cells Through Hollow Optical Fibers", *The American Society for Cell Biology Thirty-Seventh Annual Meeting*, (Dec. 17, 1997).

Odde, D. J., et al., "Laser-guided direct writing for applications in biotechnology", *Trends in Biotechnology*, (Oct. 1999),385-389.

Renn, M. J., et al., "Evanescent-wave guiding of atoms in hollow optical fibers", *Physical Review A*, (Feb. 1996),R648-R651.

Renn, M. J., et al., "Laser-Guidance and Trapping of Mesoscale Particles in Hollow-Core Optical Fibers", *Physical Review Letters*, (Feb. 15, 1999),1574-1577.

Renn, M. J., et al., "Laser-Guided Atoms in Hollow-Core Optical Fibers", *Physical Review Letters*, (Oct. 30, 1995),3253-3256.

Renn, M. J., et al., "Optical-dipole-force fiber guiding and heating of atoms", *Physical Review A*, (May 1997),3684-3696.

Renn, M. J., et al., "Particle Manipulation and Surface Patterning by Laser Guidance", *Submitted to EIPBN '98, Session AM4*, (1998).

Renn, Michael J., et al., "Particle manipulation and surface patterning by laser guidance", *J. Vac. Sci. Technol. B*, American Vacuum Society,(Nov./Dec. 1998),3859-3863.

Sobeck, et al., *Technical Digest: 1994 Solid-State Sensor and Actuator Workshop*, (1994),647.

TSI Incorporated, "How A Virtual Impactor Work", www.tsi.com, (Sep. 21, 2001).

Vanheusden, K., et al., "Direct Printing of Interconnect Materials for Organic Electronics", *IMAPS ATW, Printing an Intelligent Future*, (Mar. 8-10, 2002),1-5.

* cited by examiner

*Primary Examiner*—Alain L Bashore
(74) *Attorney, Agent, or Firm*—Philip D. Askenazy; Peacock Myers, P.C.

(57) ABSTRACT

Apparatuses and processes for maskless deposition of electronic and biological materials. The process is capable of direct deposition of features with linewidths varying from the micron range up to a fraction of a millimeter, and may be used to deposit features on substrates with damage thresholds near 100° C. Deposition and subsequent processing may be carried out under ambient conditions, eliminating the need for a vacuum atmosphere. The process may also be performed in an inert gas environment. Deposition of and subsequent laser post processing produces linewidths as low as 1 micron, with sub-micron edge definition. The apparatus nozzle has a large working distance—the orifice to substrate distance may be several millimeters—and direct write onto non-planar surfaces is possible.

43 Claims, 7 Drawing Sheets

~ 25 mm

APPARATUSES AND METHODS FOR MASKLESS MESOSCALE MATERIAL DEPOSITION

CROSS-REFERENCE TO RELATED APPLICATIONS

Figure 1:
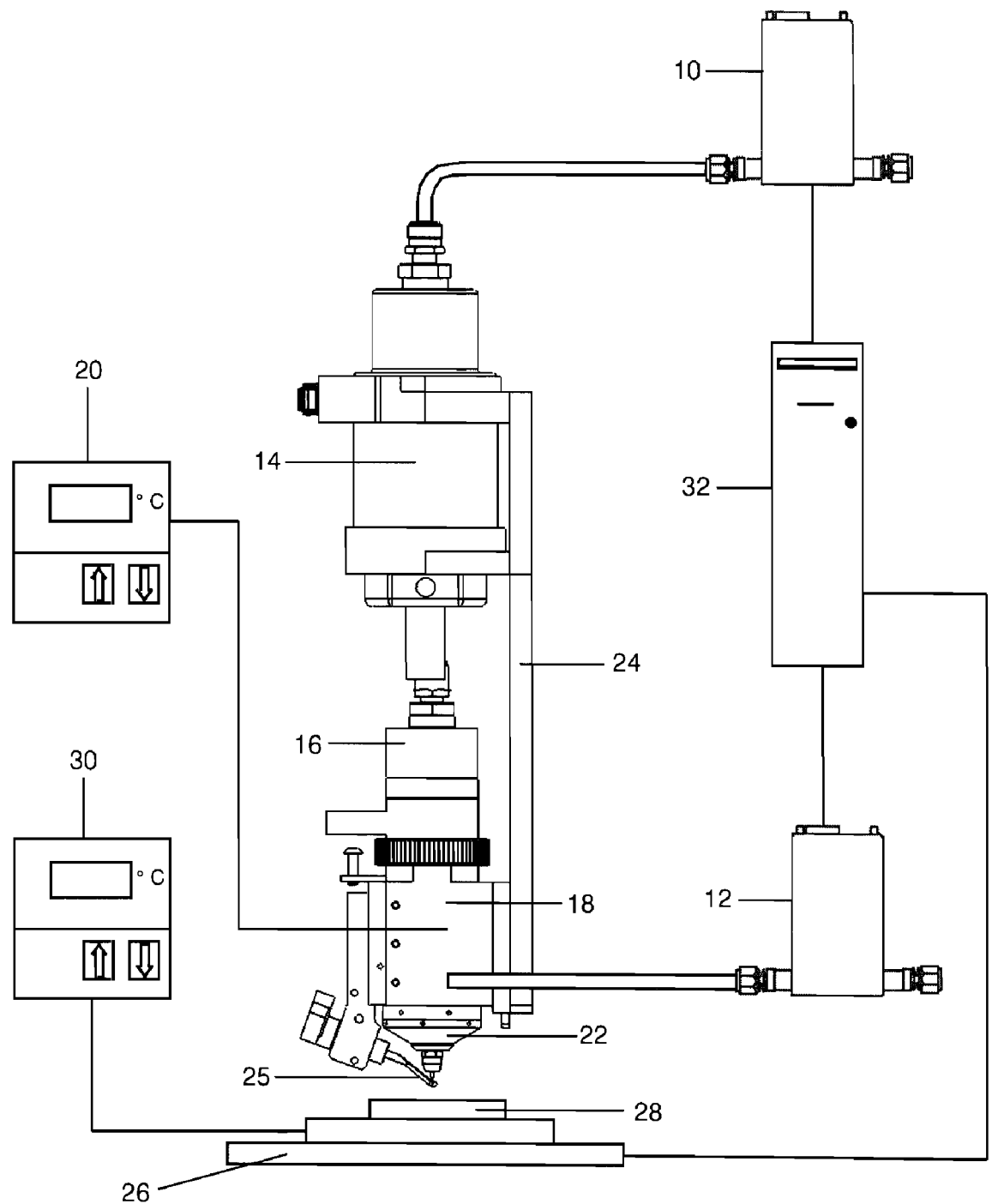

This application is a divisional application of U.S. patent application Ser. No. 10/346,945, entitled "Apparatuses And Method For Maskless Mesoscale Material Deposition", to Michael J. Renn, et al., filed on Jan. 17, 2003, which application is a continuation-in-part application of the following U.S. Patent Applications:

U.S. patent application Ser. No. 09/574,955, entitled "Laser-Guided Manipulation of Non-Atomic Particles", to Michael J. Renn, et al., filed on May 19, 2000, which was a continuation application of U.S. patent application Ser. No. 09/408,621, entitled "Laser-Guided Manipulation of Non-Atomic Particles", to Michael J. Renn, et al., filed on Sep. 30, 1999, which claimed the benefit of U.S. Provisional Patent Application Ser. No. 60/102,418, entitled "Direct-Writing of Materials by Laser Guidance", to Michael J. Renn, et al., filed on Sep. 30, 1998;

U.S. patent application Ser. No. 09/584,997, entitled "Particle Guidance System", to Michael J. Renn, filed on Jun. 1, 2000, which was a continuation-in-part application of U.S. patent application Ser. No. 09/574,955;

U.S. patent application Ser. No. 10/060,960, entitled "Direct Write™ System", to Michael J. Renn, filed on Jan. 30, 2002, which was a continuation-in-part application of U.S. patent application Ser. Nos. 09/584,997 and 09/574,955; and U.S. patent application Ser. No. 10/072,605, entitled "Direct Write™ System", to Michael J. Renn, filed on Feb. 5, 2002, which was a continuation-in-part application of U.S. patent application Ser. Nos. 09/584,997 and 09/574,955; and the specifications of all of the preceding references are incorporated herein by reference.

FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. N00014-99-C-0243 awarded by the U.S. Department of Defense.

FIELD OF THE INVENTION

The present invention relates generally to the field of direct write deposition.

BACKGROUND OF THE INVENTION

The present invention relates to maskless, non-contact printing of electronic materials onto planar or non-planar surfaces. The invention may also be used to print electronic materials on low-temperature or high-temperature materials, and is performed without the need for an inert atmosphere. It is also capable of deposition of micron-size features.

DESCRIPTION OF THE PRIOR ART

Various techniques may be used for deposition of electronic materials, however thick film and thin film processing are the two dominant methods used to pattern microelectronic circuits. Recently, ink jetting of conductive polymers has also been used for microelectronic patterning applications. Thick film and thin film processes for deposition of electronic structures are well-developed, but have limitations due to high processing temperatures or the need for expensive masks and vacuum chambers. Ink jetted conductive polymers have resistivities that are approximately six orders of magnitude higher than bulk metals. Thus, the high resistivity of ink jetted conductive polymers places limitations on microelectronic applications. One jetting technique disclosed in U.S. Pat. Nos. 5,772,106 and 6,015,083 use principles similar to those used in ink jetting to dispense low-melting temperature metal alloys, i.e. solder. The minimum feature size attainable with this method is reported to be 25 microns. No mention, however, of deposition of pure metals on low-temperature substrates is mentioned. U.S. Pat. Nos. 4,019,188 and 6,258,733 describe methods for deposition of thin films from aerosolized liquids. U.S. Pat. No. 5,378,505 describes laser direct write of conductive metal deposits onto dielectric surfaces. Metal precursors were dropped or spin-coated onto alumina or glass substrates and decomposed using a continuous wave laser. The Maskless Mesoscale Material Deposition ($M^3D$™) apparatus, on the other hand, provides a method for the direct write of fine features of electronic materials onto low-temperature or high-temperature substrates. The as-deposited line features may be as small as 10 microns, and may be treated thermally or treated using laser radiation. The $M^3D$™ process deposits liquid molecular precursors or precursors with particle inclusions, and uses a subsequent processing step that converts the deposit to the desired state. The precursor viscosity may range from approximately 1 to 1000 centi-Poises (cP), as opposed to ink jetted solutions, which are typically confined to around 10 cP. The $M^3D$™ process may also deposit aerosolized materials onto many substrates with damage thresholds as low as 100° C., and is a maskless process that can run under ambient and inert environmental conditions.

SUMMARY OF THE INVENTION

It is an object of the present invention to provide a precision aerosol jetter for high resolution, maskless, mesoscale material deposition of liquid and particle suspensions in patterns. It is another object to provide a precision aerosol jetter that deposits electronic and biological materials with patterns in the range from about 10 microns to as large as several millimeters, while being relatively free of clogging and depositing on the orifice walls with the use of a sheath gas. It is another object to provide a precision aerosol jetter that uses aerodynamic focusing to deposit a pattern onto a planar or non-planar substrate without the use of masks. It is a further object to provide post-processing treatment of the substrate thermally or photochemically to achieve physical and/or electrical properties near that of a bulk material.

These, and other objects, are achieved by the present invention, which provides a precision aerosol jetter wherein an aerosolized liquid molecular precursor, particle suspension, or a combination of both is delivered to a flowhead via a carrier gas. The aerosolized precursor combined with the carrier gas forms an aerosol stream. The carrier gas is controlled by an aerosol carrier gas flowrate. A virtual impactor may be used to reduce the carrier gas flowrate. The virtual impactor may be composed of one or many stages. The removal of the carrier gas in this manner concentrates the aerosolized mist.

A heating assembly may be used to evaporate the aerosolized mist. A preheat temperature control is used to change the heating assembly's temperature. The aerosolized mist may also be humidified to keep it from drying out. This is accomplished by introducing water droplets, vapor, or other non-water based material into the carrier gas flow. This process is useful for keeping biological materials alive.

The resulting aerosol stream enters the flowhead and is collimated by passing through a millimeter-size orifice. An annular sheath gas composed of compressed air or an inert gas, both with modified water vapor content, enters the flowhead through multiple ports to form a co-axial flow with the aerosol stream. The sheath gas serves to form a boundary layer that prevents depositing of the particles in the aerosol stream onto the orifice wall. The aerosol stream emerges from the flowhead nozzle onto a substrate with droplets or particles contained by the sheath gas.

The aerosol stream may then pass through a processing laser with a focusing head. An acousto-optic modulator controls beam shuttering.

A shutter is placed between the flowhead orifice and the substrate in order to achieve patterning. The substrate is attached to a computer-controlled platen that rests on X-Y linear stages. A substrate temperature control is used to change the substrate's temperature. The substrate may also be composed of biocompatible material. Patterning is created by translating the flowhead under computer control while maintaining a fixed substrate, or by translating the substrate while maintaining a fixed flowhead.

A control module is used to modulate and control the automation of process parameters such as aerosol carrier gas flowrate, annular sheath gas flowrate, preheat temperature, and substrate temperature. A motion control module is used to modulate and control the X-Y linear stages, Z-axis, material shutter, and laser shutter.

A BRIEF DESCRIPTION OF THE DRAWINGS

Figure 2:
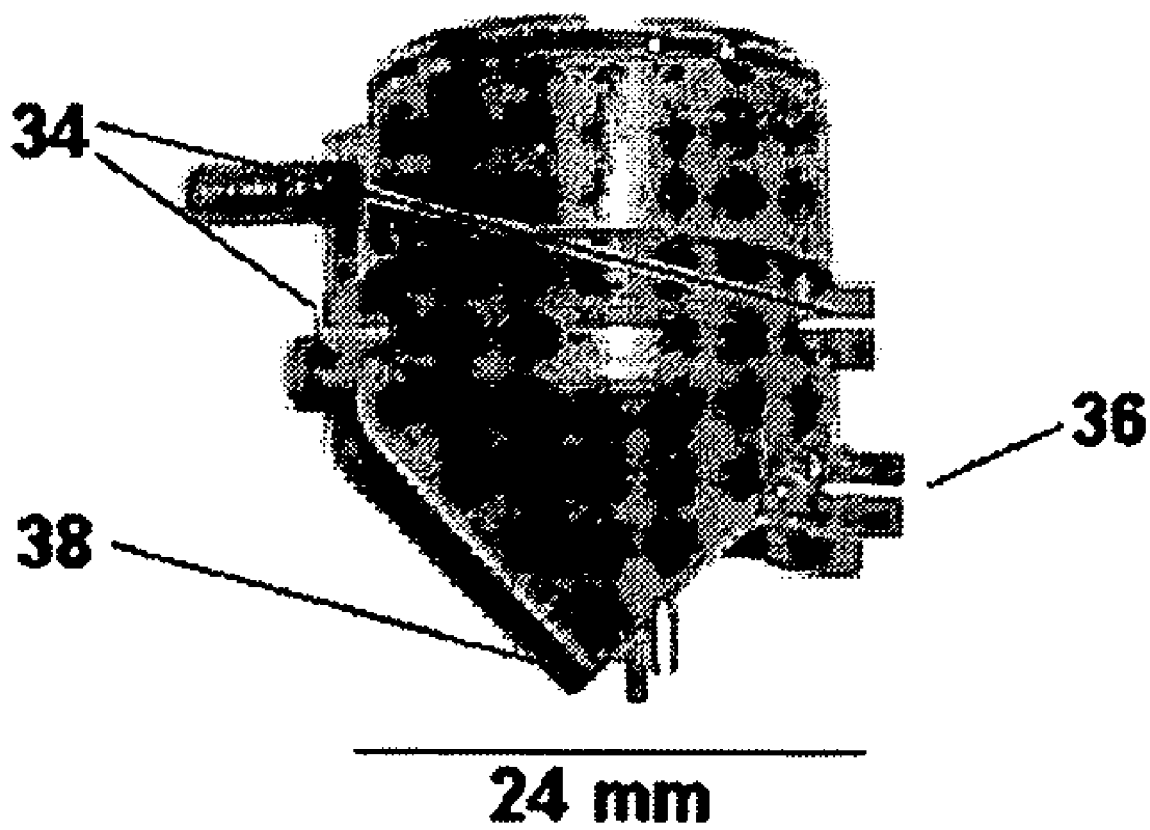
Figure 3A:
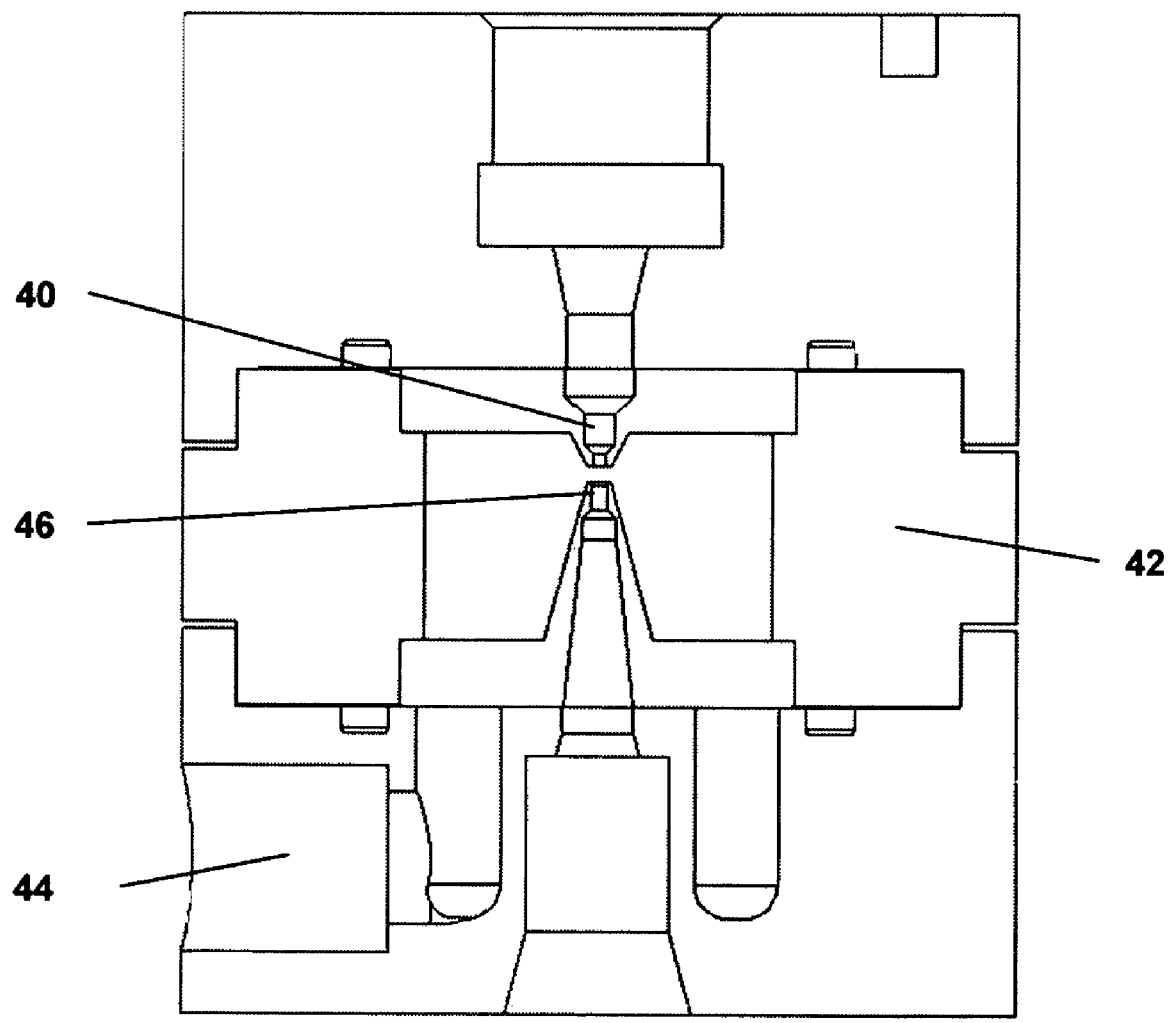
Figure 3B:
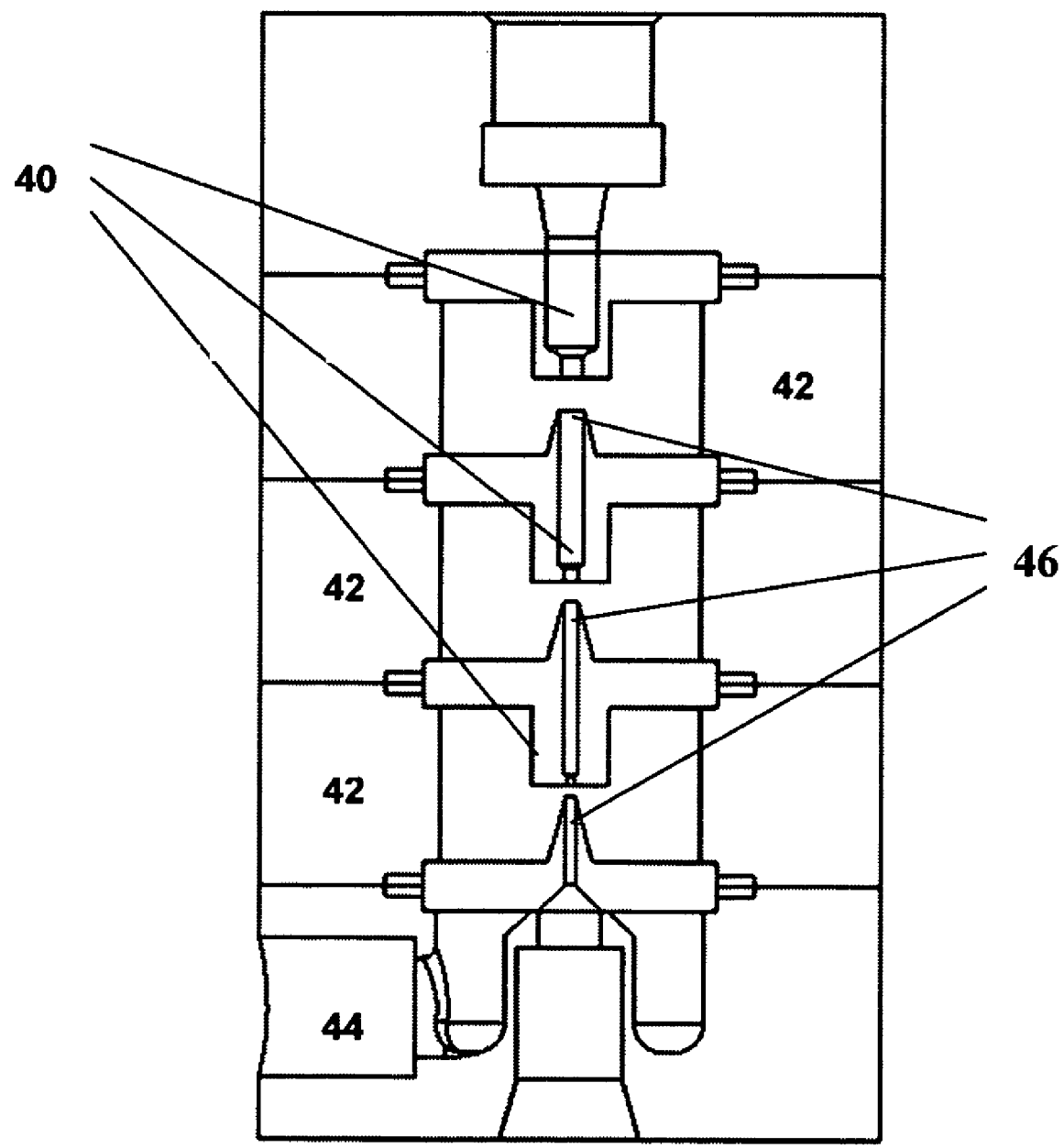
Figure 4:
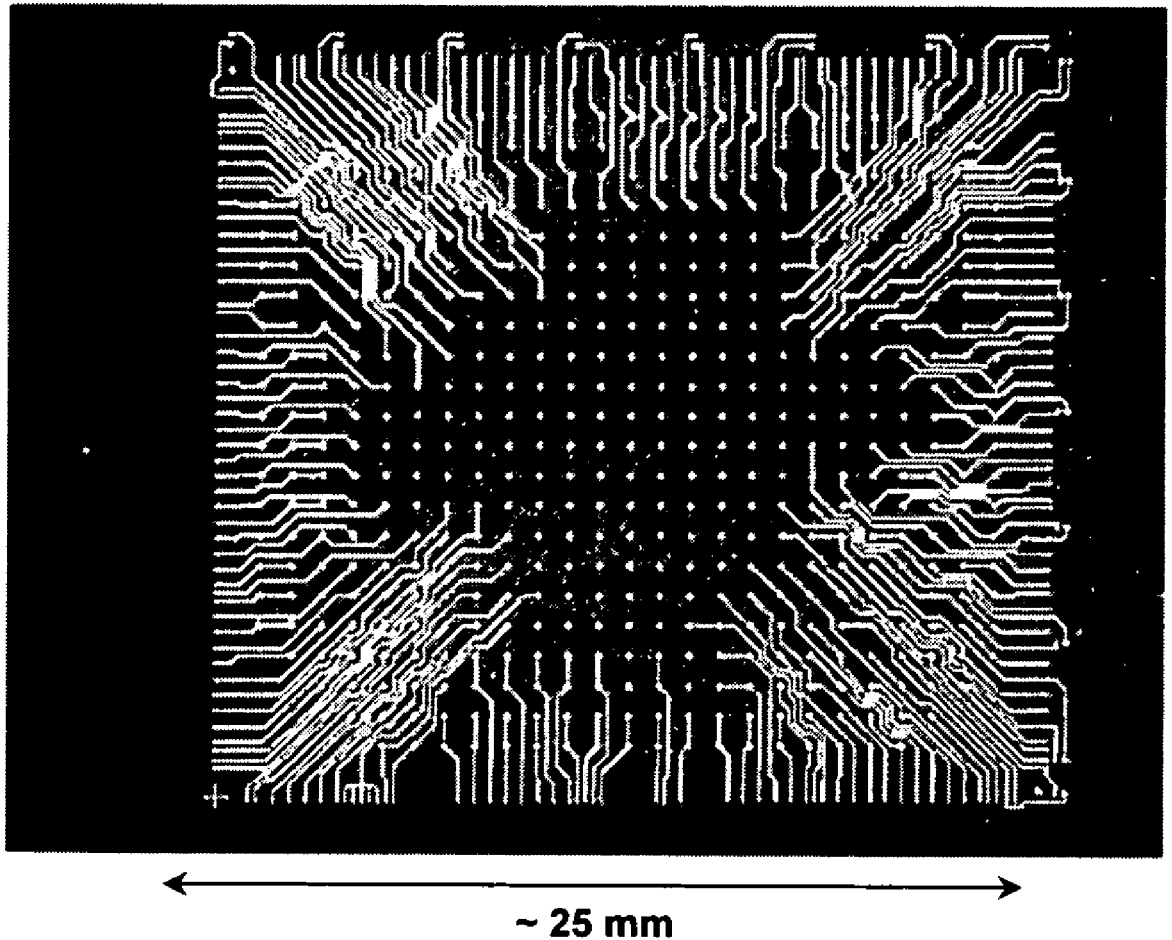
Figure 5:
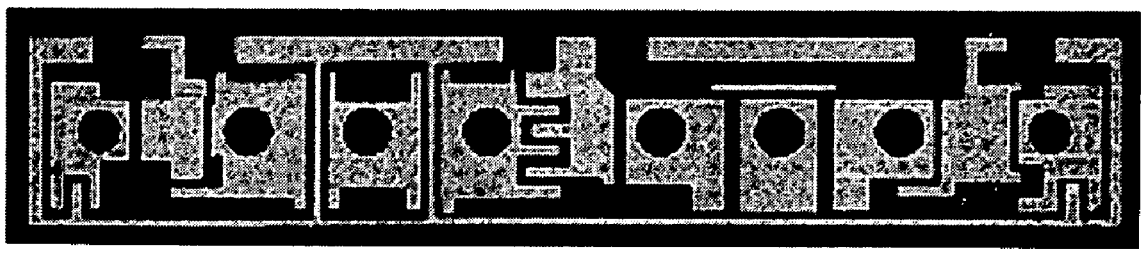
Figure 6:
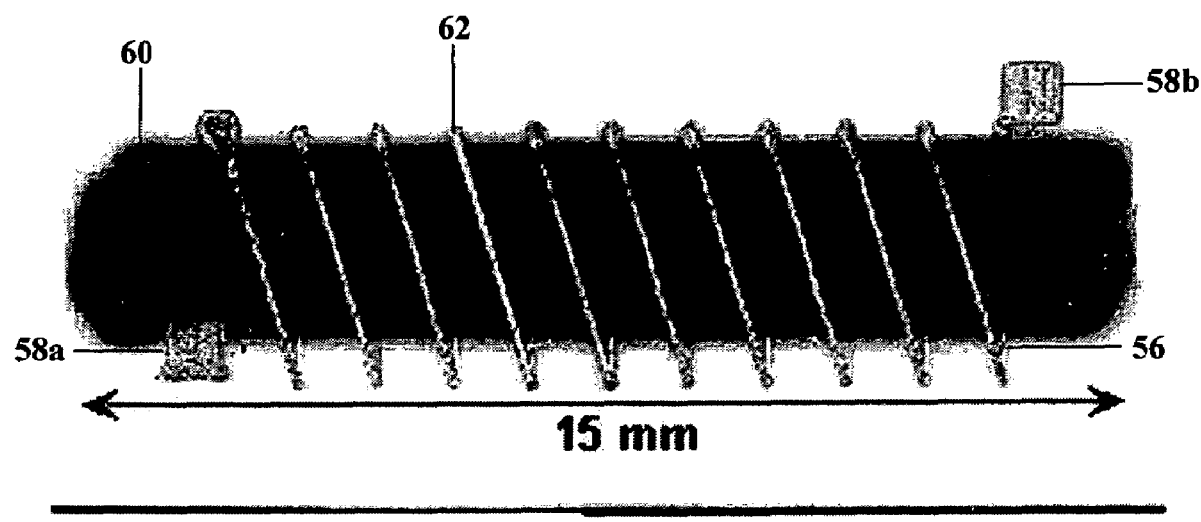

1. FIG. 1 is schematic of the $M^3D^{TM}$ apparatus.
2. FIG. 2 is a side view of the $M^3D^{TM}$ flowhead.
3. FIG. 3a is a drawing showing flow-control of a single stage virtual impactor.
4. FIG. 3b is a drawing showing flow-control of a multi-stage virtual impactor.
5. FIG. 4 shows a silver redistribution circuit deposited on Kapton™, with lines that are approximately 35 microns wide.
6. FIG. 5 shows a laser decomposed RF filter circuit on barium titanate, in which VMTool is used to pattern and decompose a silver film deposited on a barium titanate substrate.
7. FIG. 6 is a schematic representation of a three-layer direct write inductor.

A DETAILED DESCRIPTION OF THE PREFERRED AND ALTERNATIVE EMBODIMENTS

General Description

The present invention relates to apparatuses and methods for high-resolution, maskless deposition of liquid and particle suspensions using aerodynamic focusing. An aerosol stream is focused and deposited onto any planar or non-planar substrate, forming a pattern that is thermally or photochemically processed to achieve physical and/or electrical properties near that of the corresponding bulk material. The process is termed $M^3D^{TM}$, Maskless Mesoscale Material Deposition, and is used to deposit aerosolized materials with linewidths that are an order of magnitude smaller than lines deposited with conventional thick film processes. Deposition is performed without the use of masks. The term mesoscale refers to sizes from approximately 10 microns to 1 millimeter, and covers the range between geometries deposited with conventional thin film and thick film processes. Furthermore, with post-processing laser treatment, the $M^3D^{TM}$ process is capable of defining lines as small as 1 micron in width.

The present invention comprises an apparatus comprising preferably an atomizer for atomizing liquid and particle suspensions, directing, preferably a lower module for directing and focusing the resulting aerosol stream, a control module for automated control of process parameters, a laser delivery module that delivers laser light through an optical fiber, and a motion control module that drives a set of X-Y translation stages. The apparatus is functional using only the lower module. The laser module adds the additional capability of curing materials on low temperature substrates. Aerosolization is accomplished by a number of methods, including using an ultrasonic transducer or a pneumatic nebulizer. The aerosol stream is focused using the $M^3D^{TM}$ flowhead, which forms an annular, co-axial flow between the aerosol stream and a sheath gas stream. The co-axial flow exits the flowhead through a nozzle directed at the substrate. The $M^3D^{TM}$ flowhead is capable of focusing an aerosol stream to as small as one-tenth the size of the nozzle orifice. Patterning is accomplished by attaching the substrate to a computer-controlled platen. Alternatively, in a second configuration, the flowhead is translated under computer control while the substrate position remains fixed. The aerosolized fluid used in the $M^3D^{TM}$ process consists of any liquid source material including, but not limited to, liquid molecular precursors for a particular material, particulate suspensions, or some combination of precursor and particulates.

Another embodiment of the present invention is the Direct Write Biologics (DWB™) process. The DWB™ process is an extension of the $M^3D^{TM}$ process wherein biological materials are deposited in mesoscale patterns on a variety of biocompatible substrates. Like the $M^3D^{TM}$ process, an aerosol is first generated, and materials are deposited onto the desired substrate surface. Stock solutions containing biological molecules such as functional catalytic peptides, extracellular matrix (ECM) and fluorescent proteins, enzymes, or oligonucleotides have all demonstrated post-process functionality. A wide range of biological materials have been deposited using the direct-write method. Indeed, biomaterial aerosols containing biologically active molecules can be deposited into patterned structures to generate engineered substrates. In addition, possible whole cell deposition applications include embedded architecture tissue constructs and tissue-based biosensor development.

Applications of the $M^3D^{TM}$ process include, but are not limited to, direct write of circuits and devices for electronic applications, as well as the direct write of materials for biological applications.

Preferred Embodiment

1. Aerosolization

FIG. 1 shows the preferred $M^3D^{TM}$ apparatus. Like reference numerals are used to describe the same elements throughout the various figures in order to create parity and for convenience of illustration. The $M^3D^{TM}$ process begins with the aerosolization of a solution of a liquid molecular precursor or suspension of particles. The solution may also be a combination of a liquid molecular precursor and particles. As by way of example, and not intended as limiting, precursor solutions may be atomized using an ultrasonic transducer or pneumatic nebulizer 14, however ultrasonic aerosolization is limited to solutions with viscosities of approximately 1-10 cP. The fluid properties and the final material and electrical properties of the deposit are dependent on the precursor chemistry. Aerosolization of most particle suspensions is performed using pneumatics, however ultrasonic aerosolization may be used for particle suspensions consisting of either small or low-density particles. In this case, the solid particles may be suspended in water or an organic solvent and additives that maintain the suspension. Fluids with viscosities from approximately 1 to 1000 cP may be atomized pneumatically. These two methods allow for generation of droplets or droplet/particles with sizes typically in the 1-5 micron size range.

2. Flow Development and Deposition

Aerosol Delivery, Drying, and Humidification

The mist produced in the aerosolization process is delivered to a deposition flowhead 22 using a carrier gas. The carrier gas is most commonly compressed air or an inert gas, where one or both may contain a modified solvent vapor content. The carrier gas flowrate is controlled by a carrier gas controller 10. The aerosol may be modified while transiting through a heating assembly 18. The heating assembly 18 is used to evaporate the precursor solvent and additives or the particle-suspending medium. This evaporation allows for the modification of the fluid properties of the aerosol for optimum deposition. Partial evaporation of the solvent increases the viscosity of the deposited fluid. This increased viscosity allows for greater control of the lateral spreading of the deposit as it contacts the substrate 28. A preheat temperature control 20 is used to change the heating assembly's temperature. In contrast, in some cases, humidifying the carrier gas is necessary to prevent drying of the aerosol stream. Humidification of the sheath airflow is accomplished by introducing aerosolized water droplets, vapor, or other non-water based material into the flow. This method is used in the case where the solvent used for a particular precursor material would otherwise completely evaporate before the aerosol reaches the substrate 28.

General Description of Flow-Guidance

FIG. 2 shows the preferred M³D™ flowhead. In the flow guidance process, the aerosol stream enters through ports mounted on the flowhead 22 and is directed towards the orifice 38. The mass throughput is controlled by the aerosol carrier gas flowrate. Inside the flowhead 22, the aerosol stream is initially collimated by passing through a millimeter-size orifice. The emergent particle stream is then combined with an annular sheath gas. The sheath gas is most commonly compressed air or an inert gas, where one or both may contain a modified solvent vapor content. The sheath gas enters through the sheath air inlet 36 below the aerosol inlet 34 and forms a co-axial flow with the aerosol stream. The sheath gas is controlled by a sheath gas controller 12. The combined streams exit the chamber through an orifice 38 directed at the substrate 28. This co-axial flow focuses the aerosol stream onto the substrate 28 and allows for deposition of features with dimensions as small as 10 microns. The purpose of the sheath gas is to form a boundary layer that both focuses the particle stream and prevents particles from depositing onto the orifice wall. This shielding effect minimizes clogging of the orifices. The diameter of the emerging stream (and therefore the linewidth of the deposit) is controlled by the orifice size, the ratio of sheath gas flow rate to carrier gas flow rate, and the spacing between the orifice and the substrate. In a typical configuration, the substrate 28 is attached to a platen that moves in two orthogonal directions under computer control via X-Y linear stages 26, so that intricate geometries may be deposited. Another configuration allows for the deposition flowhead to move in two orthogonal directions while maintaining the substrate in a fixed position. The process also allows for the deposition of three-dimensional structures.

Virtual Impaction

Many atomization processes require a higher carrier gas flow rate than the flowhead can accept. In these cases, a virtual impactor is used in the M³D™ process to reduce the flowrate of the carrier gas, without appreciable loss of particles or droplets. The number of stages used in the virtual impactor may vary depending on the amount of excess carrier gas that must be removed. By way of example, FIG. 3a shows a single stage virtual impactor.

A single stage virtual impactor comprises a nozzle 40, a large chamber 42 with an exhaust port 44 and a collection probe 46. The nozzle 40 and collection probe 46 are opposed to each other within the chamber 42. A particulate laden gas stream, referred to as the total flow, $Q_O$ is accelerated through the nozzle 40 into the chamber 42. The jet of particulate laden gas penetrates the collection probe 46, however most of the gas flow reverses direction and exits the collection probe 46 back into the chamber 42. This flow is referred to as the major flow and is exhausted. The flow that remains in the collection probe 46 is referred to as the minor flow and is directed downstream for further processing. Particles having sufficient momentum will continue to follow a forward trajectory through the collection probe 46 and will be carried by the minor flow. Particles with insufficient momentum will be exhausted with the major flow. Momentum of the particles is controlled by the particle size and density, the gas kinematic properties, and the jet velocity. The particle size at which particles have just enough momentum to enter the collection probe 46 is referred to as the cut-point of the impactor. In order for the virtual impactor to function properly, the exhaust gas must be removed from the chamber 42 at a specific flowrate. This may be accomplished by feeding the exhaust gas through a flow control device such as a mass flow controller. In the event that ambient conditions do not provide a sufficient pressure drop to achieve the flowrates required for proper operation, a vacuum pump may be used.

In the present invention, the particles entrained in the gas stream consist of droplets, generally in the size range of 1-5 microns although droplets smaller than 1 micron and as large as 50 microns may be used. Particles larger than the cut-point enter the collection probe 46 and remain in the process. These are directed into other devices downstream of the impactor. Droplets smaller than the cut-point remain in the stripped excess gas and are no longer part of the process. These may be exhausted to the atmosphere through the exhaust port 44, filtered to avoid damaging flow control devices, or collected for reuse.

The efficiency of the virtual impactor is determined by the amount of aerosol that remains in the minor flow and is not stripped out in the major flow along with excess gas or physically impacted out in the virtual impactor. Close geometrical control of the impactor can improve the efficiency, as can control of the particle size distribution in the aerosol. By shifting the particle size distribution above the cut-point of the impactor, all the particles will remain in process, minimizing both waste and clogging. Another option exists to intentionally design an impactor stage to strip off particles below a certain size range, such that only particles above a certain size are presented to the downstream processes. Since the deposition is a physical impaction process, it may be advantageous to present only droplets of a certain size to the substrate. For example, resolution may be improved by depositing only 5 micron sized droplets. Other examples where it may be advantageous to deposit only certain sized droplets include via filling.

In the event that a single stage of virtual impaction is insufficient to remove enough excess carrier gas, multiple stages of impaction may be employed. FIG. 3b shows a multi-stage virtual impactor. In this case, the output from the collection probe 46 of the first virtual impactor is directed into the nozzle 40 of the second impactor and so on, for the required number of stages.

Shuttering

A computer-controlled material shutter 25 is placed between the flowhead orifice and the substrate 28. FIG. 1 shows the shutter. The shutter 25 functions to interrupt the flow of material to the substrate 28 so that patterning is accomplished.

Temperature Control

A substrate temperature control 30 is used to change the temperature of the substrate 28, as shown in FIG. 1.

3. Control Module

The M$^3$D™ control module provides automated control of process parameters and process monitoring. The process parameters include the aerosol and sheath gas flowrates, the aerosol preheat temperature and the substrate temperature. The control module may be operated as a stand-alone unit via manual input on the front panel, or remotely via communication with a host computer. Remote operation via a host computer is preferable for coordinating the deposition system with the other components of the M$^3$D™ system.

4. Laser Delivery Module

The M$^3$D™ apparatus uses a commercially available laser 24. Deposits are typically processed using a continuous wavelength frequency-doubled Nd:YAG laser, however processing may be accomplished with a variety of lasers, granted that the deposit is absorbing at the laser wavelength. The laser delivery module comprising a laser, a mechanical shutter, an acousto-optic modulator, delivery optics, and a focusing head. The mechanical shutter is used to rapidly turn the laser on and off in coordination with the motion control system. The acousto-optic modulator is used for rapid dynamic power control, which optionally may also be coordinated with motion. The delivery optics may be either an optical fiber and associated launch optics or mirrors. The laser delivery module is controlled via communication with the host computer.

5. Motion Control Module

The motion control module consists of a motion control card, an I/O interface, X-Y linear stages 26 for moving either the substrate or the deposition system, a z-axis for positioning the deposition system above the substrate and amplifiers for driving the stages. The I/O interface, amplifiers and associated power supplies are housed in an external, rack mountable enclosure. The motion control card typically is installed in the host computer and is connected to the I/O interface via a special cable. The I/O interface consists of analog outputs to the drive amplifiers and discrete outputs for actuating the material and laser shutters. Control of these components is handled by the motion control module rather than their respective control modules so that the timing of shuttering events can be coordinated with motion.

6. Materials

The M$^3$D™ process has been used to deposit a range of materials, including electronic and biological materials. Aerosolization of these materials may be from liquid precursor inks, particulate suspensions or combinations of both precursors and particulates. Aerosolization of fluids from roughly 1 to 1000 cP is possible. Biological materials may be deposited without loss of functionality. The materials developed specifically for the M$^3$D™ process have low processing temperatures (150° C. to 200° C.), may be written with linewidths as small as 10 microns, have excellent adhesion to plastic, ceramic, and glass substrates, and have electrical properties near that of the bulk material. Electronic materials may be processed thermally, or using laser treatment.

The M$^3$D™ process can also be used in multiple material deposition. For example, the M$^3$D™ process can be used to deposit different materials within a single layer, or it can be used to deposit different materials onto different layers.

Metals

The M$^3$D™ process can be used to deposit metals such as silver, platinum, palladium, rhodium, copper, gold, and silver/palladium and platinum/rhodium alloys. In the most general case, metal structures are formed from aerosolized liquid precursors for the desired metals, however precursors are also formulated with nanometer-size metal particles. The inclusion of nanometer-sized metal particles is beneficial to many aspects of the system, including, but not limited to, optimization of fluid properties, improved densification and final properties of the deposit. A particular strength of the apparatus/material combination is that maskless deposition onto substrates with damage thresholds as low as 150° C. may be achieved. Optimized fluid properties and apparatus parameters also allow for deposition with linewidths as small as 10 microns. Subsequent laser processing may be used to define features with linewidths as small as 1 micron. The precursor formulations also provide good adhesion to Kapton™ (as shown in FIG. 4), glass, barium titanate (as shown in FIG. 5), and various plastics.

The M$^3$D™ process can be used to direct write metal traces with linewidths as small as 1 micron, and as large as 100 microns. Electrical interconnects have been written with linewidths from 10 microns to 250 microns. In general, the resistivity of the traces is from 2 to 5 times that of the bulk metal insulators. A silver/glass formulation has been used as a low-ohmic resistive system, capable of producing traces with resistances from approximately 1 ohm to 1 kohm. The formulation consists of a silver/palladium precursor and a suspension of fumed silica particles. The process can be used to write resistor terminations, interdigitated capacitors, inductive coils, and spiral antennas and patch antennas. The M$^3$D™ process can also be used to deposit reflective metals with very low surface roughness for micro-mirror applications.

Ceramics

The M$^3$D™ process can be used to direct write ceramics, including insulators, mid- and high-k dielectrics, resistor materials and ferrites. Source materials have been precursors, colloidal suspensions and mixtures of the two. Low-k dielectric materials such as glass have been deposited both for dielectric layers in capacitor applications, as well as insulation or passivation layers. High-k dielectrics such as barium titanate can be deposited for capacitor applications, ruthenates have been deposited to form resistors and manganeses zinc ferrites have been deposited to form inductor cores.

A broad range of ceramics may be deposited and fired conventionally. However, densification on low temperature substrates can only be achieved for materials that can be densified either at temperatures below the damage threshold of the substrate or by laser treatment.

Polymers

The M³D™ process can be used to directly write polymeric materials. The liquid source materials can be monomers, solutions, suspensions, or any combination of these. Examples of polymers that have been deposited include polyimide, polyurethane and UV curable epoxies. The final treatment of the deposit is dependant on the specific polymer, but may include thermal heating, laser processing or exposure to UV. Polymeric deposits have been used as low-k dielectrics for capacitors and overcoat dielectrics for electrical and environmental insulation.

The M³D™ process can also be used to deposit traditional electronic materials onto polymers, such as polyimide, polyetheretherketone (PEEK), Teflon™, and polyester, at temperatures below those required to cause damage.

Resistive Lines

Resistive traces with resistances spanning six orders of magnitude can be deposited using the M³D™ process. A silver/glass formulation has been used as a low-ohmic system, capable of producing traces with resistances from approximately 1 ohm to 1 kohm. The formulation consists of a silver/palladium precursor and a suspension of fumed silica particles. A mid to high ohmic formulation has been developed using a suspension of ruthenium oxide particles in dimethylacetimide. Resistances from roughly 50 ohm to 1 Mohm are possible with the Ruthenium Oxide system.

Inductive Deposits

Inductive materials may also be deposited using the M³D™ process. A zinc/manganese ferrite powder combined with a low-melting temperature glass powder has been atomized and deposited onto Kapton™. Both thermal and laser processes can be used to sinter the powder. Both processes resulted in a dense well-adhered ferrite layer.

Other Materials

The M³D™ process can deposit a myriad of other materials for various processes. For example, the M³D™ process can be used to deposit sacrificial and resist materials for subsequent processing of a substrate, such as in chemical etching. It can also deposit sacrificial materials to form support structures onto or into a structure using additional materials. The M³D™ process can deposit solvent and etching chemicals to directly texture a substrate. The M³D™ process can also be used to deposit dissimilar materials in the same location for further processing to form a multi-phase mixture, alloy, or compound, and it can deposit dissimilar materials to form structures with a compositional gradient. The M³D™ process can create porosity or channels in structures by depositing fugitive materials for later removal. The M³D™ process can also deposit materials, which are structural in nature.

7. Heat Treatment

In the M³D™ process either thermal treatment or laser treatment may be used to process deposited materials to the desired state. In the case of metal precursors, dense metal lines may be formed with thermal decomposition temperatures as low as 150° C. For precursor-based materials, thermal treatment is used to raise the temperature of the deposit to its decomposition or curing temperature. In these processes, a chemical decomposition or crosslinking takes place as a result of the input of thermal energy, such that the precursor changes its molecular state, resulting in the desired material plus some effluents. An example of a chemical decomposition of a molecular precursor to a metal is that of the reaction of silver nitrate, a metal salt, to form silver plus nitrogen, oxygen, and nitrogen/oxygen compounds.

In the curing process, heat is added to the deposit until the effluents are driven off and polymerization takes place. Chemical decomposition has also been accomplished using laser radiation as the heat source. In this case, the precursor or precursor/particle combination is formulated so that the fluid is absorbing at the laser wavelength. The high absorption coefficient at the laser wavelength allows for very localized heating of the deposit, which in turn may be used to produce fine deposits (as small as 1 micron for a frequency-doubled Nd:YAG laser) with no damage to the substrate. The M³D™ process has been used to deposit and laser process silver on an FR4 substrate, which has a damage threshold of less than 200° C.

In the deposition of ceramics and other refractory powders, laser sintering is used to soften low-melting temperature particles used to bind the refractory powder. In this process the laser is scanned over the deposit and absorbed by the glass or the powder, softening the glass to the point that adhesion takes place between particles and the substrate.

In the case of DWB™, thermal treatment is used to incubate deposited samples. The goal of incubation is to produce a desired chemical reaction, such as the development of enzyme activity.

8. Direct Write of Biological Materials

Cell patterning by flow-guided direct writing may revolutionize cell patterning technology by allowing for precise cellular micro-patterning and addition of biologically active adhesion or pathway signaling biomolecules. This is the most general advantage and arguably the most revolutionary component of the DWB™ technology. The direct-write method can be used to guide and deposit 0.02 µm to 20 µm diameter biological particles onto substrate surfaces. The range of biological materials that can be deposited is extremely broad, and includes polymers, peptides, viruses, proteinaceous enzymes and ECM biomolecules, as well as whole bacterial, yeast, and mammalian cell suspensions.

9. Products and Applications

Two examples of devices that demonstrate the capabilities of the M³D™ process are described. The first device is a manganese-zinc ferrite inductor written on alumina, as shown in FIG. 6. This device demonstrates deposition of silver precursor plus laser processing of the deposit. The silver precursor is ultrasonically atomized from liquid precursor solution, In addition, a ferrite and glass particle suspension is pneumatically atomized, deposited, and laser densified. The silver deposition illustrates the capability to deposit over a non-planar surface. The second device is a silver spiral on Kapton™, demonstrating fine feature size and direct write of silver onto a low-temperature substrate.

Direct Write Inductor

A three-dimensional ferrite-core inductor has been built using the M³D™ apparatus and process. FIG. 6 shows a three-layer direct write inductor. The first step of the inductor fabrication is the deposition of parallel lines of silver precursor 56 onto an alumina substrate. The lines are approximately 100 microns wide, 1 micron thick and 1000 microns in length. The lines are laser treated to form dense, conductive silver wires. These wires are one-half of the conductive traces that will eventually wrap around a ferrite core. Silver contact pads 58a-b (1000 micron square) are also added in the first layer.

The second step is to create the inductor core 60 by depositing a mixture of Manganese-Zinc Ferrite powder and low melting temperature glass over the conductive lines. Laser sintering is used to densify the ferrite/glass deposit; the glass flows around the ferrite particles and forms a dense, connected solid after cooling. The ferrite deposition step is repeated several times to buildup the deposit to about 150 microns. The ferrite line lengths are about 1500 mm long. A typical profile of the ferrite layer is shown in FIG. 6.

The final step is to write conductive traces over the ferrite layer and connect them to the underlying traces to form the inductor coil 62. Since the flowguide head standoff distance is several mm, deposition over a mm-sized non-planar surface is possible. The resistance of a typical coil generated using this method is on the order of several ohms. The inductance is 7 micro henries and the Q value is 4.2 @ 1 MHz.

Direct Write Spiral

The M$^3$D™ process has been used to form a direct write spiral, which shows the line definition and feature size capabilities of the process. The spiral lines are 35 microns in diameter on a 60-micron pitch. The overall diameter of the coil is 2.0 mm. The start material is silver ink that was deposited and then treated at 200° C. to chemically decompose the precursors and densify the deposit. In depositing this pattern, the substrate was translated beneath the deposition head at a speed of 10 mm/s.

Other Applications

The M$^3$D™ process can be used to perform a plethora of other applications. It can perform layerwise deposition of materials to form functional devices, such as multilayer capacitors, sensors, and terminated resistors. It has the capacity to deposit multiple materials to form structures, such as interconnects, resistors, inductors, capacitors, thermocouples, and heaters, on a single layer. The M$^3$D™ process can deposit multilayer structures consisting of conductor patterns and dielectric insulating layers, in which the conductor patterns may be electrically connected by conducting vias. It can deposit a passivation material to protect or insulate electronic structures. It can deposit overlay deposits for the purpose of "additive trimming" of a circuit element, such as adding material to a resistor to alter its value. The M$^3$D™ process can also deposit these overlay deposits on top of existing structures, which is difficult to achieve with screen printing.

In the area of novel microelectronic applications, the M$^3$D™ process can deposit materials between preexisting features to alter a circuit or repair broken segments. It can deposit metal films with tapered linewidths for devices, such as a stripline antennae. It can also deposit material to form "bumps" for chip attachment. The M$^3$D™ process can deposit adhesive materials to form dots or lines for application to bonding multiple substrates and devices. The M$^3$D™ process can also deposit materials into underfill regions, in which the deposit is pulled into the underfill region by capillary forces.

In a printing application, the M$^3$D™ process can deposit three-dimensional patterns to fabricate a master stamp. It can also deposit colored pigments (e.g. red, green, blue) to generate high resolution colored deposits.

The M$^3$D™ process may also be used in several optoelectronic applications, and can deposit transparent polymers into lines and dots to serve as lenses and optical conductors. It can also deposit repetitive structures, such as lines and dots, to refract or reflect light and to serve as diffractive optical elements, such as diffraction gratings or photonic bandgaps. It can deposit metal and dielectric films with tapered film thickness, in which the films can serve as optical phase retarders that can encode holographic information into light beams. Examples of this are phase shift masks, diffractive optical elements, and holograms. The M$^3$D™ process can also deposit metal and opaque films of variable thickness for controlled reflection and absorption of light. Such a process can be used to make high-resolution portraits.

The M$^3$D™ process can deposit materials that form a thermal or chemical barrier to the underlying substrate. It can deposit materials that have a primary function of bearing a load, reducing friction between moving parts, or increasing friction between moving parts. It can also deposit materials used to form memory devices. Further, the M$^3$D™ process can deposit materials that form a logic gate.

10. Direct Write Biological (DWB™) Applications

The DWB™ initiative may be applied to material deposition applications including biosensor rapid prototyping and microfabrication, microarray bio-chip manufacturing, bioinspired electroactive polymer concept development (ambient temperature bio-production of electronic circuitry), and various additive biomaterial processes for hybrid BioMEMS and Bio-Optics. Moreover, the ability to deposit electronic and biologically viable or active materials with mesoscale accuracy has potential to advance these application areas.

The M$^3$D™ process can also be used to deposit multiple materials in a dot-array geometry for biological applications, such as for protein and DNA arrays. It can deposit passivation material to protect or insulate biological structures. It can also deposit an overlay material onto an existing structure that selectively allows migration of certain chemical or biological species to the existing structure while preventing the passage of others. Further, the M$^3$D™ process can deposit materials containing a chemical or biological species that is released as a function of time or an internal or external stimulus.

11. Topological Deposition

The M$^3$D™ process can perform various topological depositions. For example, it can deposit spots, lines, filled areas, or three-dimensional shapes. It has the capability to perform conformal deposition over curved surfaces and steps. It can deposit into channels or trenches, or onto the sides of channel walls. It can deposit into via holes as small as 25 microns.

The M$^3$D™ process can deposit across multiple substrate materials. It can deposit longitudinally or circumferentially around cylinderically-shaped objects. It can also deposit both internally or externally onto geometrical shapes having flat faces that meet as sharp corners, such as cubes. The M$^3$D™ process can deposit onto previously deposited material. It can also deposit films with variable layer thickness. Further, the M$^3$D™ process can deposit films or lines with variable widths.

CONCLUSION

Although the present invention has been described in detail with reference to particular preferred and alternative embodiments, persons possessing ordinary skill in the art to which this invention pertains will appreciate that various modifications and enhancements may be made without departing from the spirit and scope of the Claims that follow. The various configurations that have been disclosed above are intended to educate the reader about preferred and alternative embodiments, and are not intended to constrain the limits of the invention or the scope of the Claims. The List of Reference Characters which follows is intended to provide the reader with a convenient means of identifying elements of the invention in the Specification and Drawings. This list is not intended to delineate or narrow the scope of the Claims.

LIST OF REFERENCE CHARACTERS

FIG. 1
10 Carrier gas controller
12 Sheath gas controller
14 Pneumatic nebulizer/Ultrasonic atomizer
16 Virtual impactor
18 Heating assembly
20 Preheat temperature control
22 Flowhead
24 Processing laser
25 Shutter
26 X-Y linear stages
28 Substrate
30 Substrate temperature control
32 Computer FIG. 2
34 Aerosol/carrier gas inlet
36 Sheath air inlet
38 Orifice FIG. 3a
40 Nozzle
42 Chamber
44 Exhaust port
46 Collection probe
  FIG. 3b
No new reference numerals required.
  FIG. 4
No reference numerals required.
  FIG. 5
No reference numerals required.
  FIG. 6
56 Parallel lines of silver precursor
58a-b Silver contact pads
60 Inductor core
62 Inductor coil Although specific embodiments have been described and illustrated herein, it will be appreciated by those skilled in the art that any arrangement, which is calculated to achieve the same purpose, may be substituted for the specific embodiments shown. Therefore, this application is intended to cover any adaptations or variations of the present invention. Therefore, it is manifestly intended that this invention only be limited by the following claims.

What is claimed is:

1. A method for maskless material deposition of a liquid or liquid containing a particle suspension in a pattern on a target, the method comprising:
    focusing an aerosol stream comprising droplets of the liquid;
    surrounding the aerosol stream with an annular sheath gas;
    subsequently passing the particles of the precursor composition through no more than one orifice;
    depositing the aerosol stream in a pattern onto a planar or non-planar substrate without use of masks to form a deposit comprising a feature size of less than one millimeter; and
    processing the deposit so that the deposit comprises physical and/or electrical properties near those of a bulk material.

2. The method as claimed in claim 1 wherein said solution comprises one or more liquids selected from the groups consisting of liquid molecular precursors and particle suspensions.

3. The method as claimed in claim 1, wherein the liquid has a viscosity of approximately 1-10 cP.

4. The method as claimed in claim 2, wherein ultrasonic aerosolization is used for particle suspensions comprising either or both of high-density nanometer-sized particles ranging from 4 to 21 $g/cm^3$ and low-density micron-sized particles on the order of 2 $g/cm^3$ or less.

5. The method as claimed in claim 1, wherein said aerosol stream includes biological materials selected from the group consisting of functional catalytic peptides, extracellular matrix and fluorescent proteins, enzymes, and oligonucleotides.

6. The method as claimed in claim 1, wherein said aerosol stream is delivered to a deposition head via a carrier gas.

7. The method as claimed in claim 6, wherein the carrier gas comprises a solvent vapor.

8. The method as claimed in claim 6, wherein a humidification process of the carrier gas and/or the annular sheath gas is used to prevent the drying of the aerosol stream.

9. The method as claimed in claim 8, wherein the humidification process comprises introducing aerosolized water droplets and/or water vapor into the carrier gas flow and/or the aerosol stream.

10. The method as claimed in claim 1, wherein a heating assembly is used to evaporate a solvent and/or a suspending fluid.

11. The method as claimed in claim 10, wherein said evaporation modifies fluid properties of said aerosol stream.

12. The method as claimed in claim 11, wherein partial evaporation of the solvent or the suspending fluid increases viscosity and allows for greater control of a lateral spreading of resulting deposited fluid.

13. The method as claimed in claim 1, wherein a mass throughput of an aerosolized mist is controlled by an aerosol carrier gas flowrate.

14. The method as claimed in claim 13, wherein concentration of said aerosolized mist is accomplished by partial removal of said carrier gas.

15. The method as claimed in claim 14, wherein said carrier gas is partially removed by one or more stages of a virtual impactor.

16. The method as claimed in claim 1, wherein the sheath gas comprises one or both of a compressed air and an inert gas comprising water vapor content.

17. The method as claimed in claim 1, wherein the annular sheath gas enters through multiple ports below multiple aerosol ports and forms a co-axial flow between the aerosol stream and the sheath gas stream.

18. The method as claimed in claim 17, wherein the sheath gas forms a boundary layer that focuses the aerosol stream and/or prevents particles from depositing onto an orifice wall.

19. The method as claimed in claim 17, wherein said co-axial flow exits a flowhead through a nozzle directed at the substrate.

20. The method as claimed in claim 19, wherein said co-axial flow is focused as small as a tenth a size of said nozzle orifice.

21. The method as claimed in claim 19, further comprising the step of interrupting flow of materials to the substrate by operating a shutter placed between the nozzle orifice and the substrate.

22. The method as claimed in claim 1, wherein the processing step comprises raising a temperature of the deposit to the deposit's decomposition, sintering, or curing temperature via thermal processing.

23. The method as claimed in claim 22, wherein the thermal treatment of a deposit comprising a precursor causes a chemical decomposition or crosslinking to occur, thereby changing a molecular state of the precursor, resulting in a desired material plus effluents.

24. The method as claimed in claim 1, wherein the liquid is atomized using an ultrasonic transducer or a pneumatic nebulizer.

25. The method as claimed in claim 1, wherein the substrate comprises a biocompatible substrate.

26. The method as claimed in claim 21, further comprising the step of translating the flowhead relative to the substrate.

27. The method as claimed in claim 26, wherein patterning features of the deposit range in scale from approximately 10 microns to as large as several millimeters.

28. The method as claimed in claim 1, wherein the deposit comprises one or more elements selected from the group consisting of an electrical interconnect; a resistor termination, an interdigitated capacitor; an inductive core or coil; a spiral antenna; a patch antenna; a reflective metal for micromirror applications; a dielectric layer for capacitor applications; an insulating or passivating layer; an overcoat dielectric; patterned biological cells; one or more interconnects, resistors, inductors, capacitors, thermocouples, or heaters on a single layer; an overlay deposit; a structure deposited between preexisting features to alter a circuit or repair a broken circuit element; a metal film comprising a tapered linewidth; colored pigments; patterned transparent polymer; periodic optical structures, variable thickness metal and/or opaque film; a thermal or chemical barrier to the underlying substrate; a chemical or biological species which is time released or released in response to a certain internal or external stimulus; and a film or line comprising a variable linewidth.

29. The method of claim 28 wherein the electrical interconnect comprises a linewtdth between about 10 microns and about 250 microns.

30. The method of claim 28 wherein the spiral antenna comprises silver and the substrate comprises Kapton™.

31. The method of claim 28 wherein the overlay deposit is used for additive trimming of a circuit element and/or is disposed on top of an existing structure.

32. The method of claim 28 wherein the metal film comprising a tapered linewidth is used for a stripline antenna.

33. The method of claim 28 wherein the colored pigments comprise red, green, and blue pigments and/or are used in a high resolution display.

34. The method of claim 28 wherein the patterned transparent polymer comprises lines and or dots and forms a lens or an optical conductor.

35. The method of claim 28 wherein the periodic optical structures refract and/or reflect light and form a diffractive optical element.

36. The method of claim 35 wherein the diffractive optical element comprises a diffraction grating or a photonic bandgap.

37. The method of claim 28 wherein the overlay deposit is used for additive trimming of a circuit element and/or is disposed on top of an existing structure.

38. The method of claim 28 wherein the variable thickness metal and/or opaque film controls reflection and absorption of light.

39. The method of claim 38 wherein the variable thickness metal and/or opaque film is used in a high-resolution portrait.

40. The method of claim 1 further comprising the step of rapidly prototyping and/or microfabricating a biosensor.

41. The method of claim 1 wherein the aerosol stream is deposited in one or more ways selected from the group consisting of into a channel or trench, on the side of a channel wall or trench wail, conformally over a curved surface, conformally over a step, into a via hole, across multiple substrate materials, and longitudinally or circumferentially around a cylindrically-shaped object.

42. The method as claimed in claim 1, wherein the processing step comprises photochemically processing the deposit.

43. The method as claimed in claim 42, wherein the deposit is photochemically processed by a laser.

* * * * *